United States Patent
Jelaca et al.

(10) Patent No.: US 10,840,798 B1
(45) Date of Patent: Nov. 17, 2020

(54) BIDIRECTIONAL SIGNALING METHOD FOR HIGH-VOLTAGE FLOATING CIRCUITS

(71) Applicant: Dialog Semiconductor (UK) Limited, London (GB)

(72) Inventors: Nebojsa Jelaca, Graz (AT); Horst Knoedgen, Munich (DE); Christoph N. Nagl, Graz (AT)

(73) Assignee: Dialog Semiconductor (UK) Limited, London (GB)

( * ) Notice: Subject to any disclaimer, the term of this patent is extended or adjusted under 35 U.S.C. 154(b) by 121 days.

(21) Appl. No.: 16/146,580

(22) Filed: Sep. 28, 2018

(51) Int. Cl.
| H02M 1/088 | (2006.01) |
| H02M 3/158 | (2006.01) |
| H03K 17/687 | (2006.01) |
| H02M 1/00 | (2006.01) |

(52) U.S. Cl.
CPC ........... *H02M 1/088* (2013.01); *H02M 3/158* (2013.01); *H03K 17/6871* (2013.01); *H02M 2001/0048* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| 7,026,665 B1 | 4/2006 | Smart et al. |
| 2007/0228416 A1 | 10/2007 | Chen et al. |
| 2008/0042143 A1 | 2/2008 | Yedinak et al. |
| 2008/0105954 A1 | 5/2008 | Kodama et al. |
| 2008/0122418 A1 | 5/2008 | Briere et al. |
| 2008/0230784 A1 | 9/2008 | Murphy |

(Continued)

FOREIGN PATENT DOCUMENTS

| CN | 103594509 | 2/2014 |
| JP | 2013016627 | 1/2013 |
| JP | WO2014/103126 | 1/2017 |

OTHER PUBLICATIONS

"GaN FET module performance advantage over silicon," by Narendra Mehta, Texas Instruments, Mar. 2015, pp. 1-5.

(Continued)

*Primary Examiner* — Jue Zhang
*Assistant Examiner* — Henry E Lee, III
(74) *Attorney, Agent, or Firm* — Saile Ackerman LLC; Stephen B. Ackerman

(57) ABSTRACT

A high-voltage power converter with a high-side switch coupled with a high-voltage input and a high-side switch control coupled with the high-side switch are presented. The high-side switch control drives the high-side switch on and off. There is a low-side switch coupled via an output node to the high-side switch. The low-side switch is on when the high-side switch is off and vice versa. A supply capacitor is coupled with a low-voltage supply terminal. The high-side switch control to provides a supply voltage for the high-side switch control. A communication module is coupled with the high-side switch control to provide a bidirectional communication between the high-side switch control and a control system that operates in a low-voltage domain, wherein the communication to and from the high-side switch control is enabled when the low-side switch is on and the high-side switch is off.

23 Claims, 11 Drawing Sheets

(56) References Cited

U.S. PATENT DOCUMENTS

| | | |
|---|---|---|
| 2009/0008679 A1 | 1/2009 | Saito |
| 2009/0032820 A1 | 2/2009 | Chen |
| 2009/0090984 A1 | 4/2009 | Khan et al. |
| 2010/0117095 A1 | 5/2010 | Zhang |
| 2011/0025397 A1 | 2/2011 | Wang et al. |
| 2011/0227095 A1 | 9/2011 | Treu et al. |
| 2011/0260174 A1 | 10/2011 | Hebert |
| 2012/0139589 A1 | 6/2012 | Machida et al. |
| 2013/0241621 A1 | 9/2013 | Forghani-Zadeh et al. |
| 2014/0015591 A1 | 1/2014 | Chen et al. |
| 2014/0027785 A1 | 1/2014 | Rose |
| 2014/0042452 A1 | 2/2014 | Pendharkar et al. |
| 2014/0055109 A1 | 2/2014 | Guerra et al. |
| 2014/0138701 A1 | 5/2014 | Huang et al. |
| 2014/0145208 A1 | 5/2014 | Rose et al. |
| 2014/0252367 A1 | 9/2014 | Pendharkar et al. |
| 2014/0284655 A1 | 9/2014 | Ikeda |
| 2014/0284662 A1 | 9/2014 | Ikeda |
| 2014/0327010 A1 | 11/2014 | Pendharkar et al. |
| 2014/0374766 A1 | 12/2014 | Bahl et al. |
| 2015/0014698 A1 | 1/2015 | Briere |
| 2015/0021614 A1 | 1/2015 | Forghani-Zadeh et al. |
| 2015/0162321 A1 | 6/2015 | Briere |
| 2015/0171750 A1 | 6/2015 | Zeng et al. |
| 2015/0200583 A1 | 7/2015 | Huang et al. |
| 2016/0154037 A1* | 6/2016 | Kasturi ............ G01R 19/16538 323/271 |

OTHER PUBLICATIONS

"Gate Drivers for Enhancement Mode GaN Power FETs," Copyright 2012 Texas Instruments Incorporated, 3 pgs.

EPC Technology Brief: TB001, Enhancement-Mode Gallium Nitride Power Transistor Technology, Copyright 2015, pp. 1-4.

EPC Technology Brief: AN003, Using Enhancement Mode GaN-on Silicon Power FETs (eGaN FETs), Copyright 2014, pp. 1-9.

EPC Technology Brief: WP001, Gallium Nitride (GaN) Technology Overview, Copyright 2012, pp. 1-6.

* cited by examiner

BIDIRECTIONAL SIGNALING METHOD FOR HIGH-VOLTAGE FLOATING CIRCUITS

TECHNICAL FIELD

The present document relates to high-voltage floating circuits such as e.g. switched mode high-voltage power converters.

BACKGROUND

In such circuits, a node floats over a wide range, e.g. a mid node of a half bridge floating between ground and a high-voltage supplied at a high-side terminal of the high-side switch. The same applies in switched-mode power converters such as buck converters that are designed to convert a high rail voltage such as 400V down to a voltage useful for usage in electronic equipment. During operation, when alternately the high-side switch or the low-side switch is turned on and off, the node that connects the high-side and the low-side switch experiences a large voltage sweep. Together with this node, the entire high-side driver circuit is subject to the high-voltage and a large variation of its voltages versus ground. When the high-side switch is on (and consequently, the low-side switch is off), the node connecting high and low-side switches reaches the high-voltage, and consequently the high-side control terminal (e.g. the gate of a MOSFET) must have a similarly high-voltage versus ground, as applies for the circuit that controls and drives the switch's control terminal.

Thus, any signaling or communication between a control system for the high-voltage floating circuit, typically operating in a low-voltage domain as is common for digital circuits (e.g. 5V), and the high-side driver floating at much higher voltages must bridge this voltage gap. For this purpose, level shifters may be applied. However, level shifting typically results in significant power loss. A direct level shift from the high-side driver to the low-side domain requires a high-voltage p-channel MOS device (ca. 600 V) which is practically not available, and therefore the signal cannot be transferred directly to ground. A high-voltage n-channel MOS device has a typical sink current of a few milliamperes. Any data transfer during the high-side turn-on time will thus result in high power dissipation (e.g. several watts).

SUMMARY

Thus, there is a need for an efficient exchange of information between the floating high-voltage high-side portion of a device and a ground-related control system operating in low-voltage domain while the at same time reducing the power losses to a minimum. The proposed circuits provide efficient means for exchange of information between the floating high-voltage high-side portion of the device (e.g. a power converter) and the ground-related control system. Thus, the high-side device can exchange information with the control system in an efficient way, which can be used for protection from overstress or communication of any other relevant system data for optimum control and robust operation. Also, the information is transferred/signaled with low power loss during the low-side turn-on phase.

According to a first broad aspect, a high-voltage power converter is disclosed, comprising a high-side switch coupled with a high-voltage input; a high-side switch control coupled with the high-side switch, the high-side switch control alternately driving the high-side switch on and off; a low-side switch coupled via an output node to the high-side switch, the low-side switch being on when the high-side switch is off and vice versa; a supply capacitor coupled with a low-voltage supply terminal and the high-side switch control to provide a supply voltage for the high-side switch control; and a communication module coupled with the high-side switch control to provide a bidirectional communication between the high-side switch control and a control system that operates in a low-voltage domain, wherein the communication to and from the high-side switch control is enabled when the low-side switch is on and the high-side switch is off. A first terminal of the supply capacitor may be coupled via a high-voltage diode with the low-voltage supply terminal, and a second terminal of the supply capacitor may be coupled to the output node. IN particular, the supply capacitor may be connected with the cathode of the diode. The signaling of information (only) during the time period when the low-side switch is on and the high-side switch is off, allows for low power loss.

In embodiments, the communication module may comprise a controlled switch in parallel to a resistor, the switch selectively switched on and off by the communication module to signal data to the control system. The high-voltage power converter may further comprise a communication terminal coupled with the controlled switch and the parallel resistor. The communication terminal may be coupled via a second high-voltage diode to a driver of the control system. In particular, the cathode of the diode may be connected with the controlled switch and the parallel resistor. By switching the controlled switch on and off during times when the low-side switch is on, the voltage at the communication terminal can be modulated, which can be detected by the driver of the control system, thereby providing for the communication from the high-side device to the control system.

The driver of the control system may comprise an inverter and a resistor, wherein control data for the high-side device is applied to the inverter. The communication module may comprise an inverter coupled to the communication terminal to receive the control data from the communication terminal, thereby providing for the communication from the control system to the high-side device.

In embodiments, an internal node of the high-side device connected to the controlled switch and the parallel resistor may be coupled to a first terminal of a low-voltage diode (anode). A first terminal of the supply capacitor may be coupled to a second terminal of the low-voltage diode (cathode). Then, the switch can be selectively switched on and off to modulate the voltage at the low-voltage supply terminal, when the low-side switch is on and the high-side switch is off. The modulation of the supply voltage is used to transfer the information and, because of the low-voltage diode, does not influence the supply voltage of the high-side switch control.

The driver of the control system may comprise a resistor to measure the voltage drop across the resistor when the low-side switch is on. The voltage drop across the resistor is an indication of the modulated voltage at the low-voltage supply terminal and allows the control system to decode the data sent from the communication module. On the other side, the communication module may comprise an inverter coupled to the internal node to receive input data from the control system.

According to a second broad aspect, a high-voltage power converter is disclosed, comprising a high-side switch coupled with a high-voltage input; a high-side switch control coupled with the high-side switch, the high-side switch control alternately driving the high-side switch on and off; a low-side switch coupled via an output node to the high-side switch, the low-side switch being on when the high-side switch is off and vice versa; a supply capacitor coupled with a low-voltage supply terminal and the high-side switch control to provide a supply voltage for the high-side switch control; and a fault detection and signaling module to detect a fault condition of the power converter and to signal the fault condition to a control system that operates in a low-voltage domain. The signaling of the fault condition is enabled when the low-side switch is on and the high-side switch is off, thereby providing for an efficient signaling with low power dissipation. A first terminal of the supply capacitor may be coupled via a high-voltage diode (the supply capacitor connected at the cathode side of the diode) with the low-voltage supply terminal and the second terminal of the supply capacitor may be coupled to the output node.

The control system may comprise a voltage measuring unit to measure, during portions of the time when the low-side switch is on, a voltage of the supply capacitor, thereby providing for the communication from the high-side device to the control system. As already mentioned, the power energy for the high-side switch control is stored in the supply capacitor. The capacitor is also used to store the fault condition information by reducing its voltage to a predefined level.

The voltage measuring unit may comprise a high-voltage switch that is (only) enabled during portions of the time when the low-side switch is on. Alternatively, the voltage measuring unit may comprise a resistor to measure a voltage drop across the resistor when the low-side switch is on.

The fault detection and signaling module may comprise a fault condition latch that is triggered upon detection of a fault condition such as an overcurrent. The fault condition latch stores the detected fault condition until the latch is reset.

In embodiments, the fault detection and signaling module may comprise a current sensing portion to detect an overcurrent in the high-side switch.

The fault detection and signaling module may comprise a controlled switch and a Zener diode that is connected with the low-voltage supply terminal. The controlled switch is (only) enabled during portions of the time when the low-side switch is on and the high-side switch is off, thereby selectively reducing the supply voltage provided by the supply capacitor. This condition can be detected by the control system, thereby providing for an efficient signaling of the fault condition to the control system.

The control system may comprise a high-voltage switch that is connected with the output of the fault condition latch. The high-voltage switch is (only) enabled during portions of the time when the low-side switch is on and the high-side switch is off. Thus, the state of the fault condition latch is directly detected by the control system.

According to another broad aspect, a method for operating a high-voltage power converter is disclosed. The high-voltage power converter comprises a high-side switch coupled with a high-voltage input; a high-side switch control coupled with the high-side switch, the high-side switch control alternately driving the high-side switch on and off; a low-side switch coupled via an output node to the high-side switch, the low-side switch being on when the high-side switch is off and vice versa; and a supply capacitor coupled with a low-voltage supply terminal and the high-side switch control to provide a supply voltage for the high-side switch control. The method comprises communicating between the high-side switch control and a control system that operates in a low-voltage domain, during a time period when the low-side switch is on and the high-side switch is off.

The communicating step may comprise selectively switching a controlled switch on and off to signal data to the control system. The method may further comprise measuring, at the control system and when the low-side switch is on, a voltage that is representative of the state of the controlled switch, the measured voltage being a voltage in the low-voltage domain and decoupled from the high-voltage domain of the power converter via a high-voltage diode.

The high-voltage power converter may comprise a communication terminal coupled with the controlled switch and the parallel resistor. The communication terminal may be coupled via a high-voltage diode to a driver of the control system. The communication module may comprise an inverter coupled to the communication terminal to receive input data via the communication terminal from the control system.

The controlled switch may be selectively switched on and off when the low-side switch is on, to modulate the voltage at the low-voltage supply terminal. A voltage drop across a resistor of the control system may be measured when the low-side switch is on, to determine the voltage at the low-voltage supply terminal.

The method may further comprise detecting a fault condition of the power converter and signaling the fault condition to the control system via said communicating, wherein the signaling of the fault condition is enabled when the low-side switch is on and the high-side switch is off.

The communicating step may comprise modulating the supply voltage provided by the supply capacitor and measuring, by the control system, the supply voltage provided by the supply capacitor via the low-voltage supply terminal.

The method may further comprise triggering a fault condition latch (SR) upon detection of a fault condition; and detecting, by the control system, the state of the fault condition latch when the low-side switch is on.

The switches mentioned above may be MOSFET devices such as n or p channel MOS devices.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

The present document describes four embodiments for exchanging information between a floating high-side device and a control system which operates in the low-voltage domain. The first embodiment provides bidirectional communication with the high-side driver using a dedicated pin with a high-voltage isolation diode. The data transfer is triggered during the low-side turn-on phase. The second embodiment provides bidirectional communication using modulation of the bootstrap voltage, which reduces a need for a high-voltage isolation diode. The data transfer is triggered during the low-side turn-on phase. The third embodiment is intended for fault detection and systems where the bootstrap voltage is already sensed for control purposes. The fault condition is detected from the high-side to the ground-related system by reducing the bootstrap voltage at some defined level. This reduced level retains the information and can be measured during the low-side turn-on phase. The isolation is done by using a high-voltage MOSFET. The forth embodiment uses a separate pin for fault detection. In this case the fault condition is detected and stored during the high-side turn-on phase. The flag will be sensed during the low-side turn-on phase. The isolation is done by using a high-voltage MOSFET.

Figure 1:
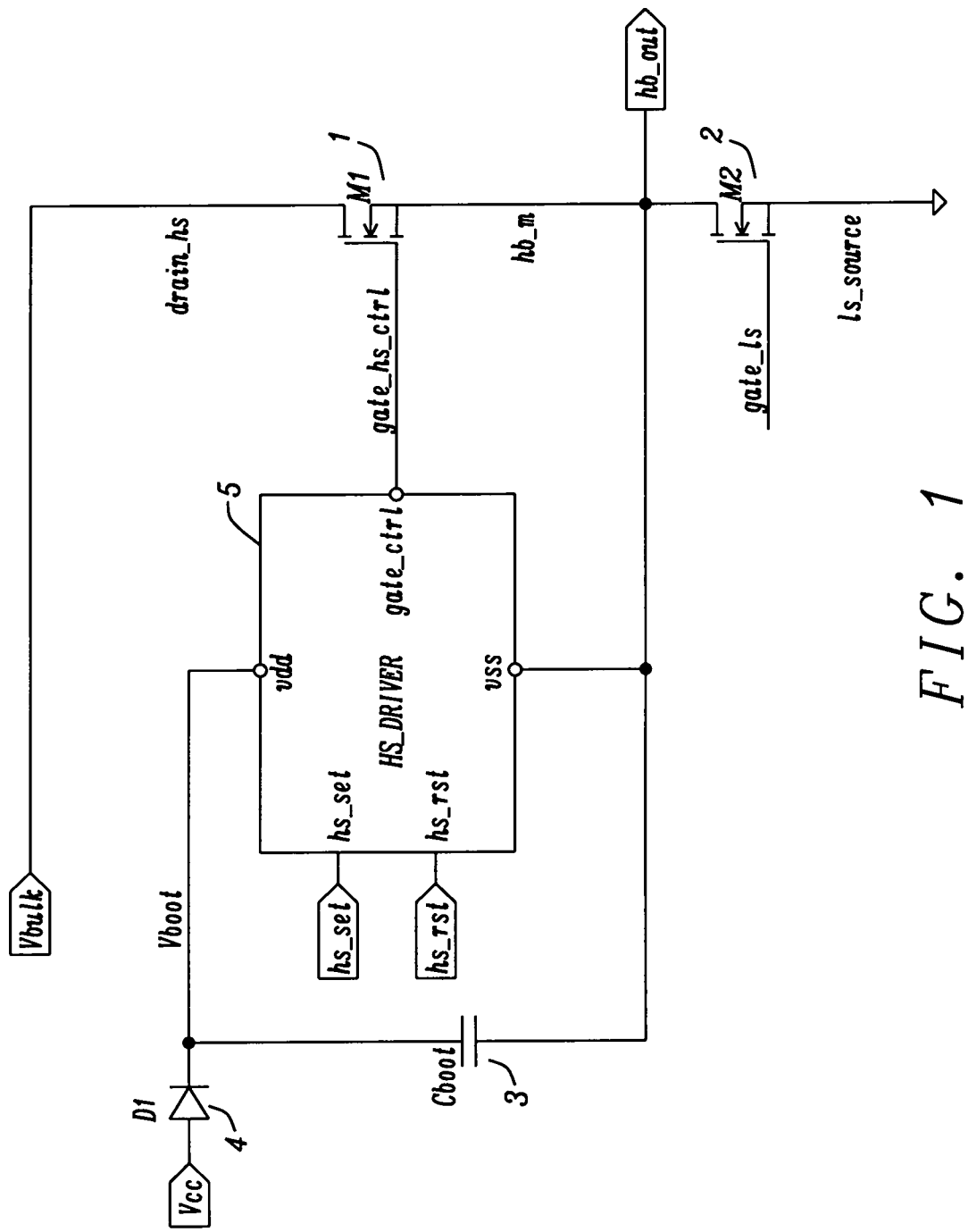
FIG. 1 shows a high-side driver circuit.

A half-bridge (HB) topology as shown in FIG. 1, is frequently used in switched-mode power supplies (SMPS). The HB topology comprises two power switches, high-side (HS) M1 1 and low-side (LS) M2 2 switch. The two switches are turned on and off in a complementary way with some non-overlapping dead time.

Figure 2:
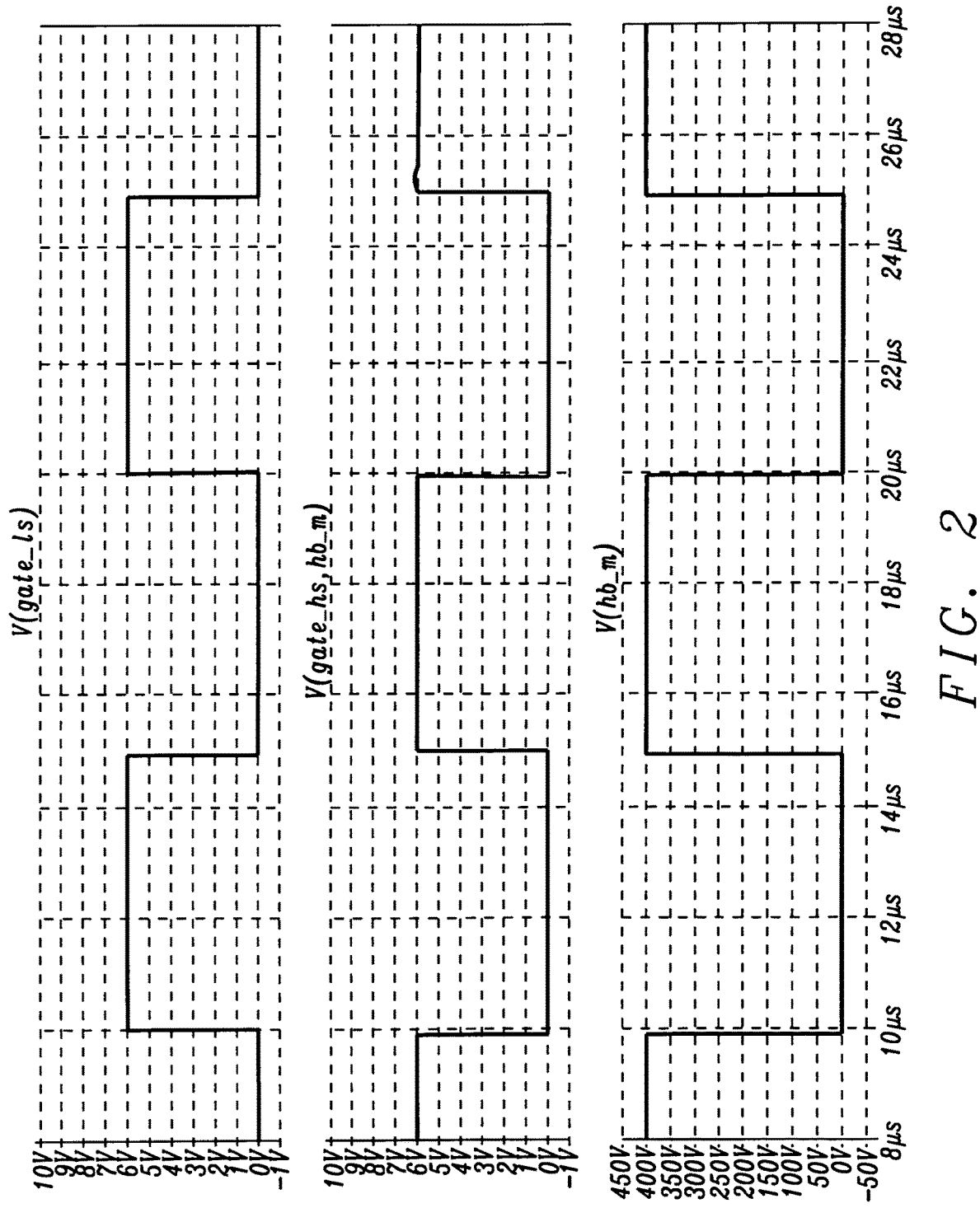
FIG. 2 shows half bridge switching waveforms.

The voltage at the switch (output) node hb_m switches between the high-voltage rail and ground depending on the switching phase. FIG. 2 shows the typical switching waveforms of the half bridge when driving an inductive load at the output. The topmost waveform shows the gate voltage Vgate_ls of the low-side switch and the next panel shows the gate voltage of the high-side switch Vgate_hs with respect to the voltage at output node hb_m (sometimes also called node Lx). The lowest panel shows the voltage Vhb_m at the output node between low and high-side switch, which alternates between 0V and 400V.

The high-side driver 5 and the source of the high-side switch are connected to the output node hb_m which alternates between two voltages. The high-side circuit is supplied with power from the bootstrap capacitor Cboot 3 during the high-side turn-on cycle. The bootstrap capacitor is charged from the external power source during the low-side turn-on cycle across the high-voltage isolation diode D1 4 and drain-source of the low-side switch. Because of the floating output node, the control of the high-side driver is typically implemented with level shifters, which must sustain the high-voltage difference. Consequently, the transfer of the information from and to the floating high-side domain is challenging.

The present document describes four concepts which can be used for the information transfer between the high-side domain and ground-related control system.

Figure 3:
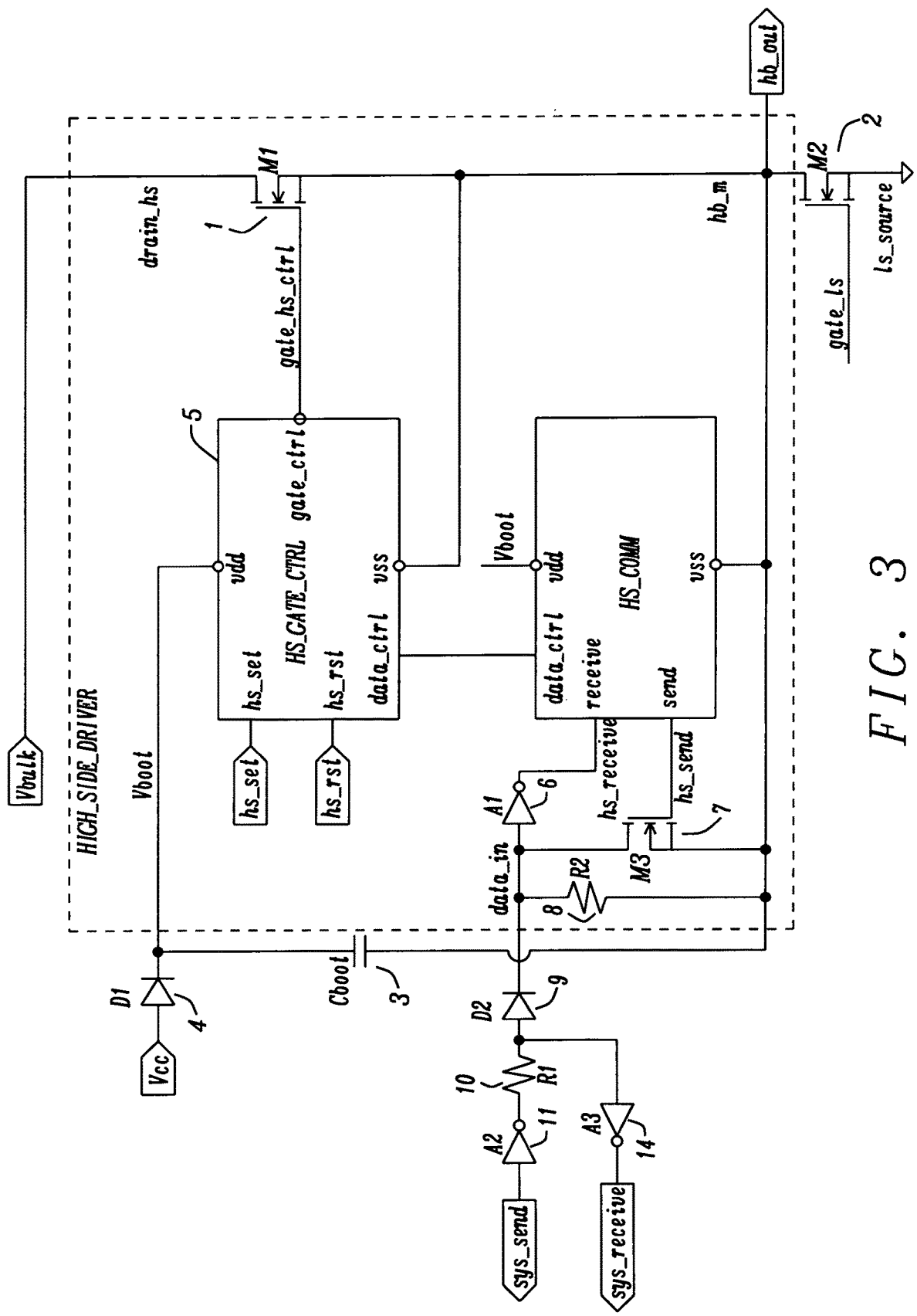
FIG. 3 shows a circuit for bidirectional communication between high-side device and control system.

The first embodiment provides bidirectional communication with the high-side driver using a dedicated pin with a high-voltage isolation diode. The data transfer is triggered during the low-side turn-on phase. FIG. 3 shows the first embodiment for bidirectional communication to the high-side driver.

The figure shows a circuit for a switched mode high-voltage power converter comprising a high-side switch M1 1 coupled with a high-voltage input Vbulk and a high-side switch control 5 coupled with the high-side switch 1. The high-side switch control 5 alternately drives the high-side switch 1 on and off. Further provided is a low-side switch M2 2 coupled via an output node hb_m to the high-side switch 1 (in particular to the source of FET M1). The low-side switch 2 is on when the high-side switch 1 is off and vice versa. A supply (bootstrap) capacitor Cboot 3 is coupled with a low-voltage supply terminal VCC and the high-side switch control 5 to provide a supply voltage vboot for the high-side switch control. A first terminal of the supply capacitor 3 is coupled via a high-voltage diode D1 4 with the low-voltage supply terminal VCC and a second terminal of the supply capacitor 3 is coupled to the output node hb_m that is connected to the output terminal hb_out of the power converter.

A communication module is coupled with the high-side switch control 5 to provide a bidirectional communication between the high-side switch control and a control system that operates in a low-voltage domain. The communication to and from the high-side switch control 5 is enabled when the low-side switch 2 is on and the high-side switch 1 is off. The communication module comprises a controlled switch M3 7 in parallel to a resistor R2 8, the switch M3 7 selectively switched on and off to signal data to the control system. A communication terminal is coupled with the controlled switch M3 7 and the parallel resistor 8. The communication terminal is coupled via a second high-voltage diode D2 9 to a driver of the control system. The communication module further comprises an inverter 6 coupled to the communication terminal to receive input data from the communication terminal. The driver of the control system comprises an inverter A2 11 and a resistor R1 10 in series connection to communicate data to the high-voltage part of the power converter. The driver of the control system further comprises another inverter A3 14 coupled with the communication terminal to receive data from the high-voltage part of the power converter.

In the depicted embodiment, the high-side driver comprises the high-side switch control 5, the high-side switch M1 1 and the communication module. At least these elements may be provided on a single driver chip. The supply capacitor Cboot 3 and the diodes D1 4, D2 9, may be external devices. However, other circuit designs are possible where, e.g., the high-side switch M1 1 is external, or the diodes integrated in the driver IC. Diode D2 9 is a high-voltage isolation diode. It blocks the high-voltage difference when the high-side is turned on. The communication is done during the low-side turn-on phase. The data from the system to the high-side is transferred via inverter A2, R1, diode D2 and inverter A1 while M3 is turned off.

For the data transfer from the high-side to the ground-related system the sys_send signal is kept low, means output of inverter A2 is high and R1 in combination with M3 forms an inverter. The data is received by inverter A3 which has its input pulled down by M3 enabled from the high-side circuit.

The R1 is a pull up resistor for the M3 when the data is transferred from the high-side to the control system and the R2 is discharging the data_in node when information is transferred from the system to the high-side device.

Figure 4:
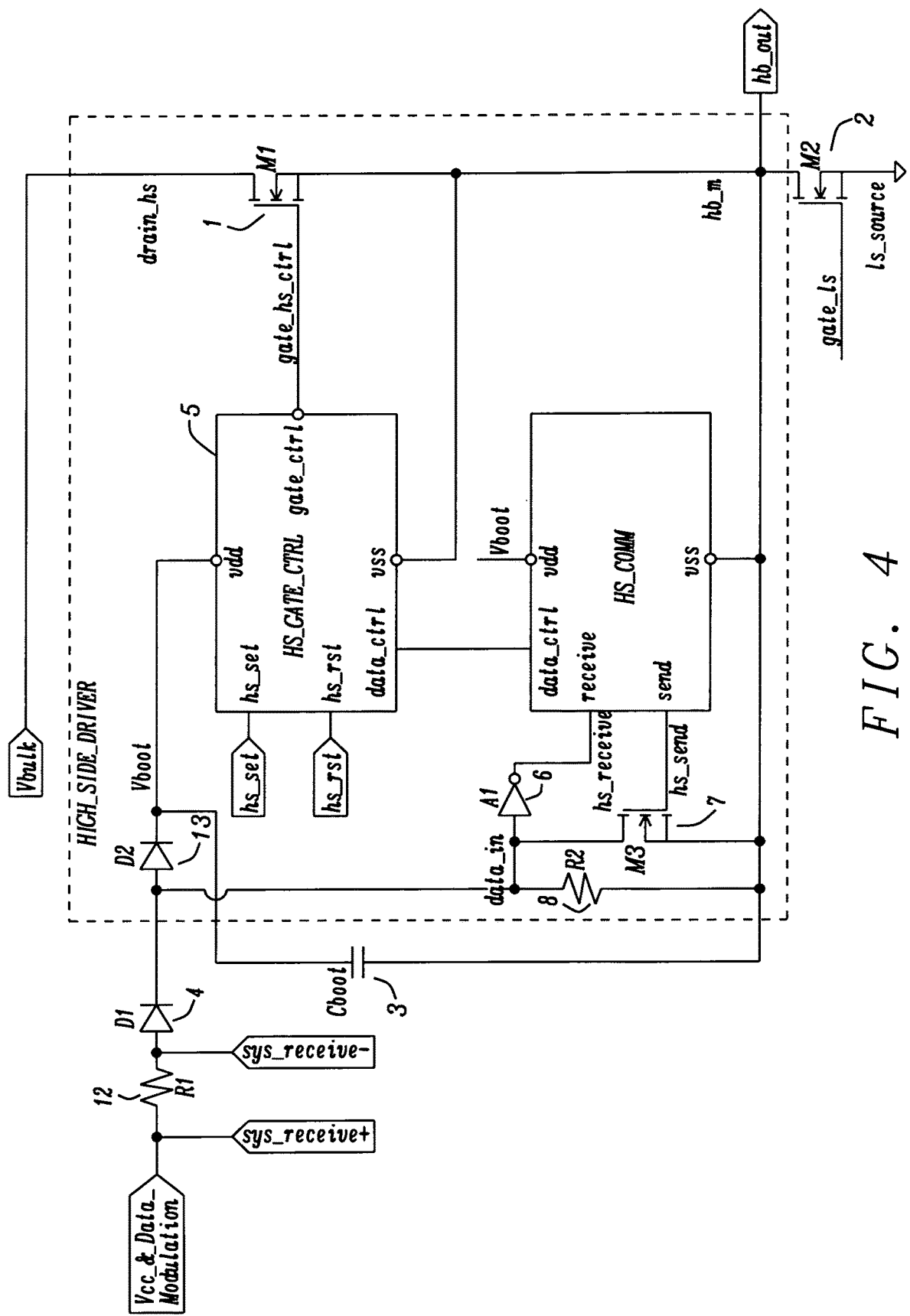
FIG. 4 shows another circuit for bidirectional communication with Vcc modulation.

The second embodiment is shown in FIG. 4 and is an extended variation of the communication concept as described for the first embodiment. The second embodiment provides bidirectional communication using modulation of the bootstrap voltage, which reduces a need for a high-voltage isolation diode. The modulation of the supply voltage is used to transfer the information and does not influence the bootstrap voltage of the high-side. The data transfer is triggered during the low-side turn-on phase. The advantage is the need of only one HV isolation diode D1 4. The communication is done during the low-side turn on phase when the HS device 1 is near ground level via M2 2. The modulation of the supply voltage is used to transfer the information and does not influence the bootstrap voltage of the high-side.

The figure shows a circuit for a switched mode high-voltage power converter comprising a high-side switch M1 1 coupled with a high-voltage input Vbulk and a high-side switch control 5 coupled with the high-side switch 1. The high-side switch control 5 alternately drives the high-side switch 1 on and off. Further provided is a low-side switch M2 2 coupled via an output node hb_m to the high-side switch 1 (in particular to the source of FET M1). The low-side switch 2 is on when the high-side switch 1 is off and vice versa. A supply (bootstrap) capacitor Cboot 3 is coupled with a low-voltage supply terminal VCC and the high-side switch control 5 to provide a supply voltage Vboot for the high-side switch control. A first terminal of the supply capacitor 3 is coupled via a high-voltage diode D1 4 and a low-voltage diode D2 13 with the low-voltage supply terminal. A second terminal of the supply capacitor 3 is coupled to the output node hb_m that is connected to the output terminal hb_out of the power converter.

A communication module is coupled with the high-side switch control 5 to provide a bidirectional communication between the high-side switch control and a control system that operates in a low-voltage domain. The communication to and from the high-side switch control 5 is enabled when the low-side switch 2 is on and the high-side switch 1 is off. The communication module comprises a controlled switch M3 7 in parallel to a resistor R2 8, the switch M3 7 selectively switched on and off to signal data to the control system. An internal node data_in connected to the controlled switch M3 7 and the parallel resistor R2 8 is coupled to a first terminal of the low-voltage diode D2 13. A first terminal of the supply capacitor 3 is coupled to a second terminal of the low-voltage diode D2 13. The controlled switch 7 is selectively switched on and off to modulate the voltage at the low-voltage supply terminal. The driver of the control system comprises a resistor R1 12 to measure the voltage drop across the resistor 12 when the low-side switch 2 is on. The communication module further comprises an inverter A1 6 coupled to the internal node to receive input data from the control system.

In the depicted embodiment, the high-side driver comprises the high-side switch control, the high-side switch M1, diode D2 and the communication module. At least these elements may be provided on a single driver chip. The supply capacitor Cboot and the diode D1 may be external devices. However, other circuit designs are possible where, e.g., the high-side switch M1 is external, or the diode D1 integrated in the driver IC.

The data transfer from system to the high-side driver is done by decreasing the Vcc under the threshold level of inverter A1 6. The diode D2 13 blocks the Vboot discharging during the communication.

The data transfer from the high-side driver to the control system is done by switching the switch M3 7 and measuring the current (e.g. voltage drop) on R1. The supply voltage Vcc is kept constant during this phase.

The third embodiment is intended for fault detection and systems where the bootstrap voltage is already sensed for control purposes. A fault condition is detected and communicated from the high-side to the ground-related system by reducing the bootstrap voltage at the supply capacitor at some defined level. This reduced level retains the information and can be measured during the low-side turn-on phase. For isolation between high-voltage high-side and low-voltage control system, a high-voltage MOSFET is provided.

Figure 5:
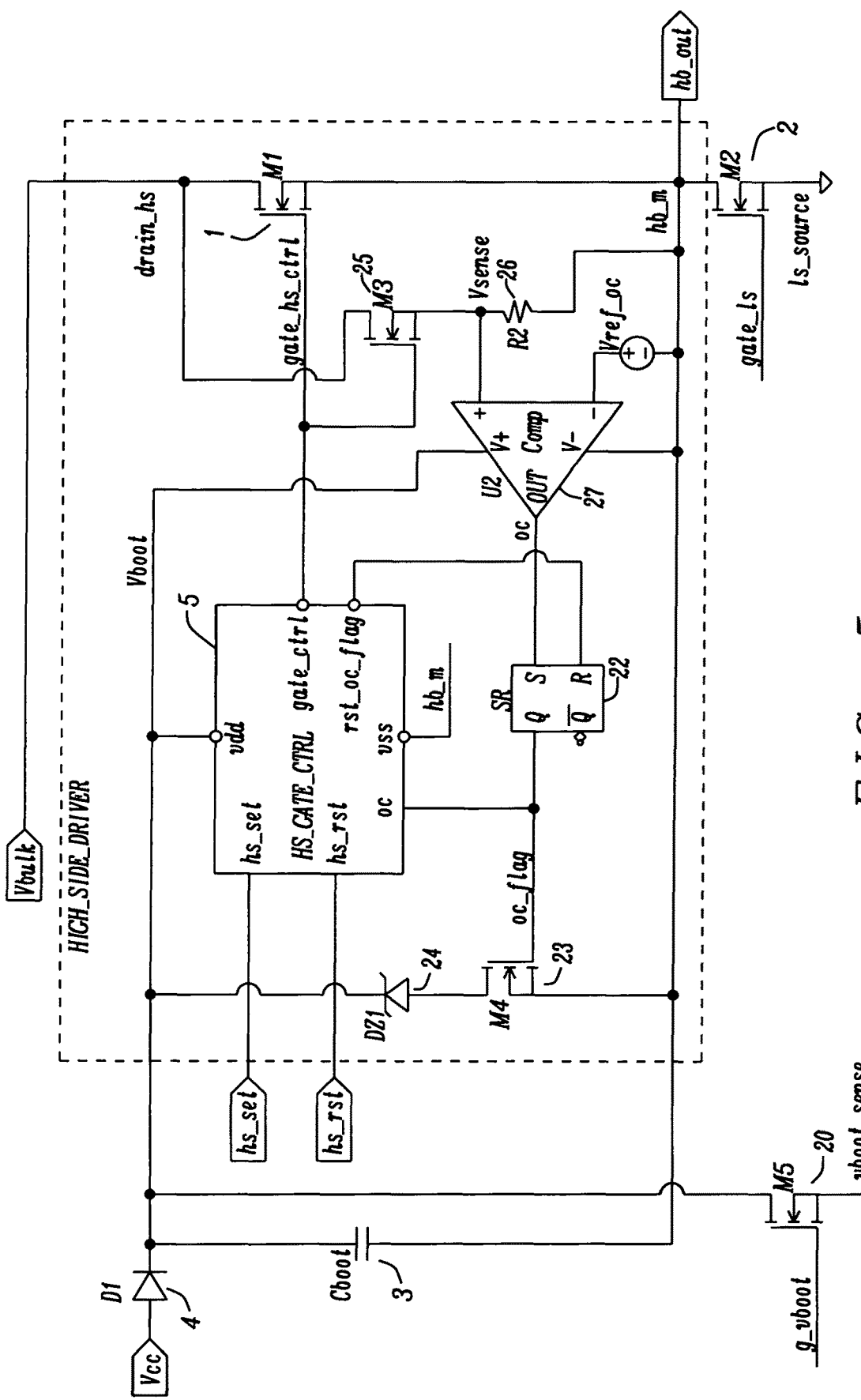
FIG. 5 shows a circuit for high-side fault detection with clamped Vboot voltage.

FIG. 5 shows a circuit for implementing the third embodiment. The illustrated switched mode high-voltage power converter comprises a high-side switch M1 1 coupled with a high-voltage input; a high-side switch control 5 coupled with the high-side switch 1, the high-side switch control 5 alternately driving the high-side switch 1 on and off; a low-side switch M2 2 coupled via an output node to the high-side switch 1 (e.g. the source of HS device 1 coupled with the drain od LS device 2), the low-side switch 2 being on when the high-side switch 1 is off and vice versa; and a supply capacitor Cboot 3 coupled with a low-voltage supply terminal and the high-side switch control 5 to provide a supply voltage for the high-side switch control. A first terminal of the supply capacitor 3 is coupled via a high-voltage diode D1 4 with the low-voltage supply terminal and the second terminal of the supply capacitor 3 is coupled to the output node. The high-voltage diode D1 4 is provided to isolate the low-voltage supply terminal from the high-voltages of the high-side circuit when the high-side switch is on. A fault detection and signaling module to detect a fault condition of the power converter and to signal the fault condition to a control system that operates in a low-voltage domain is provided in this embodiment. The signaling of the fault condition is enabled when the low-side switch 2 is on and the high-side switch 1 is off. The control system comprises a voltage measuring unit to measure, during portions of the time when the low-side switch 2 is on, a voltage of the supply capacitor 3. The voltage measuring unit comprises a high-voltage switch M5 20 that is enabled during portions of the time when the low-side switch is on. High-voltage switch M5 20 isolates the control system from the high-voltages in the high-side circuit when the high-side switch 1 is on and provide for the measurement of the voltage of the supply capacitor when the low-side switch 2 is on.

The fault detection and signaling module comprises a current sensing portion to detect an overcurrent in the high-side switch 1. The fault detection and signaling module further comprises a fault condition latch SR 22 that is triggered upon detection of a fault condition. Furthermore, a controlled switch M4 23 and a Zener diode DZ1 24 that is connected in series with the switch M4 23 and with the low-voltage supply terminal are provided. The controlled switch M4 23 is enabled during portions of the time when the low-side switch 2 is on, thereby selectively reducing the supply voltage provided by the supply capacitor 3.

FIG. 5 illustrates the concept of the fault condition (overcurrent example) transfer via reduced Vboot voltage from the high-side driver to the control system which is ground related. The reduced Vboot voltage is used to store and signal the fault condition. The fault condition, in this case the overcurrent in the high-side switch 1, is received during the turn-on time of the power switch M1 1. During the switching cycle also switch M3 25 is turned on and resistor R2 26 will measure the drain-source voltage of the switch. The voltage on R2 26 is directly proportional to the current and if it exceeds the threshold voltage Vref_oc, the comparator 27 output oc goes high and the overcurrent event will be latched. The stored overcurrent flag turns transistor M4 23 on and the voltage of the bootstrap capacitor will be discharged and clamped to Vz of the Zener diode DZ1 24.

The reduced Vboot voltage remains at the clamped level until the next charging cycle. The next charging cycle starts when the low-side switch M2 2 is turned on. The output node is close to the ground level and the system control logic can first measure the Vboot via the high-voltage isolation switch M5 20 and start the charging after the measurement. The overcurrent event flag is reset at the falling edge of the high-side gate control signal in order to avoid clamping during the charging cycle.

Figure 6:
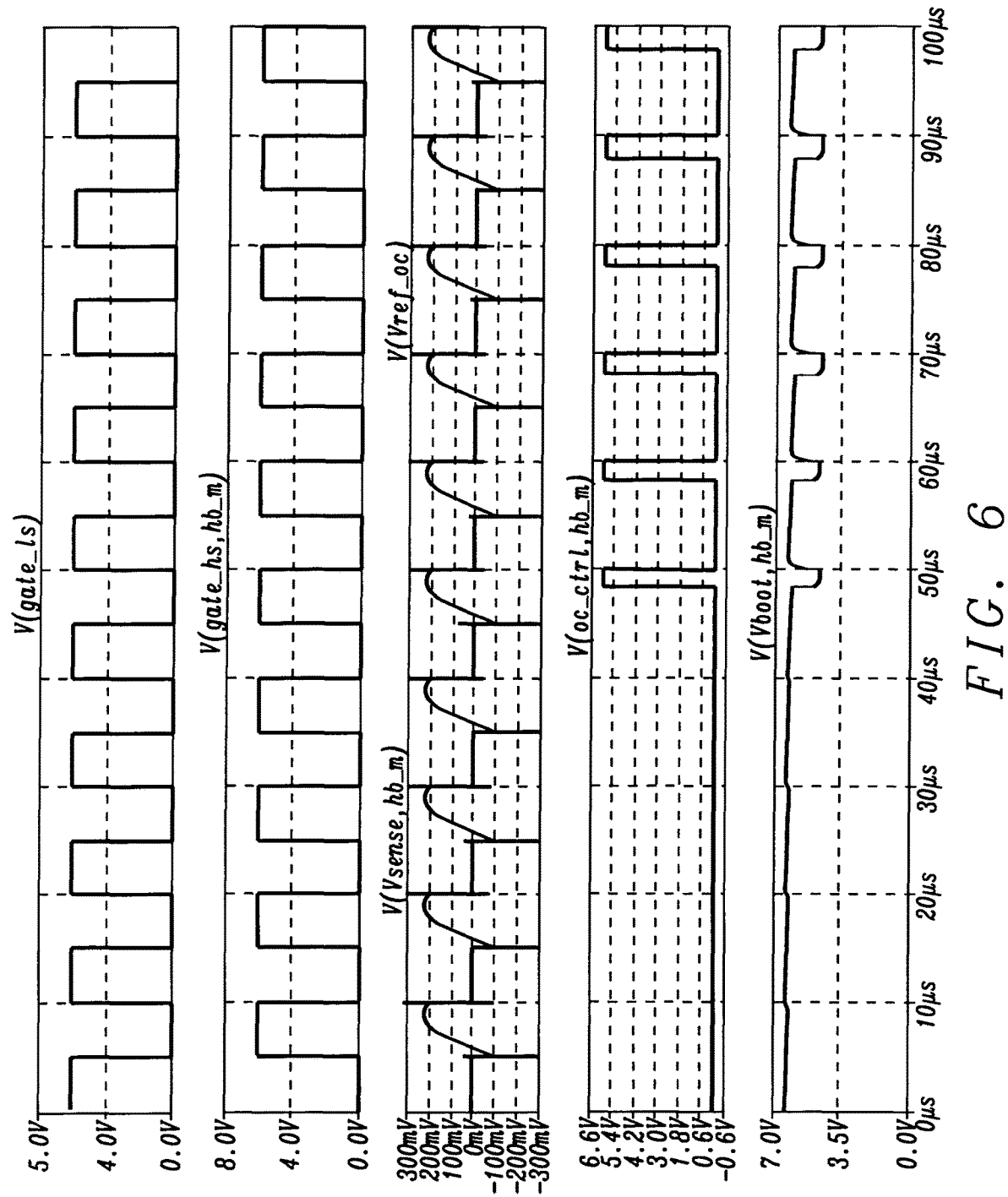
FIG. 6 shows waveforms for fault detection with clamped Vboot.
Figure 7:
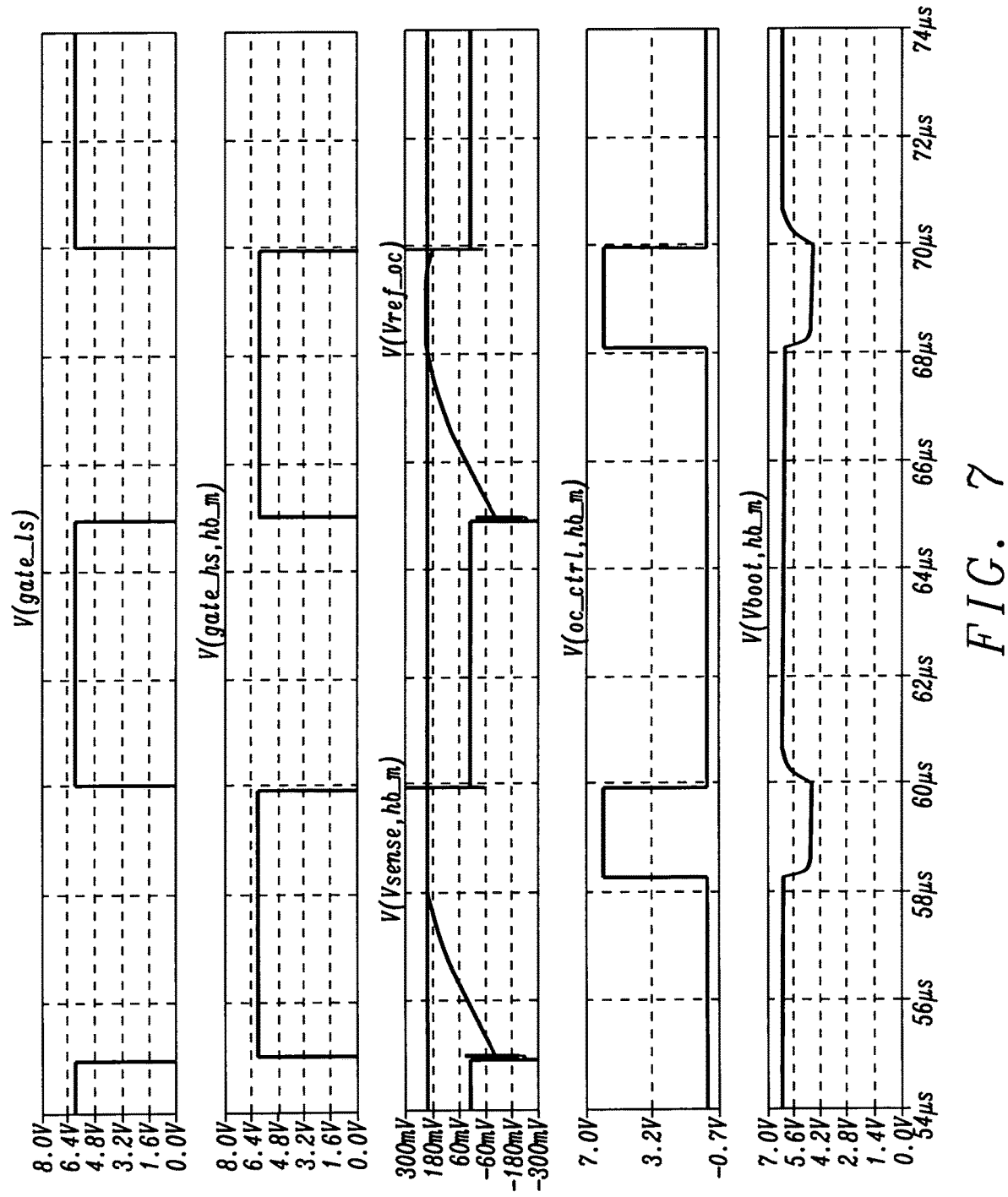
FIG. 7 shows details of the waveforms in FIG. 6.

The simulation results of the concept can be seen in FIGS. 6 and 7. The topmost waveform shows the gate voltage Vgate_ls of the low-side switch 2, and the next panel shows the gate voltage Vgate_hs of the high-side switch 1 with respect to the voltage at output node hb_m. The middle panel shows the sense voltage Vsense at the current sense node Vsense with respect to the output node hb_m. The current sense node Vsense is arranged in-between sensing transistor M3 25 and resistor R2 26. Sensing transistor M3 25 is in current mirror configuration to high-side switch M1 1. The mid panel also shows the reference voltage Vref_oc and indicates the points in time when the sense voltage Vsense reaches and extends this reference voltage. Since the sense voltage Vsense is proportional to the current through the high-side switch, the comparator Comp 27 can detect the overcurrent condition in the high-side switch. This is shown in the next panel which represents the voltage Voc_ctrl at the Q output of the latch SR 22 that is triggered by the comparator 27 and reset by the gate control logic. Voltage Voc_ctrl drives switch M4 23 which, when turned on, via Zener diode DZ1 24, pulls down the supply voltage Vboot for periods of time when the overvoltage condition is detected. The lowest waveform in FIG. 6 shows the supply voltage Vboot with respect to the output node hb_m. It is to be noted that Vboot with respect to ground (as seen by the control system) is offset by the output node voltage Vhb_m. To isolate the temporary high-voltage of Vboot from the control system, high-voltage transistor M5 20 is provided. Transistor M5 20 may be a high-voltage FET and is switched on at least for portions when the low-side switch is on to measure Vboot and detect the overvoltage condition. Transistor M5 is switched off when the high-side switch is on. The gate control signal g_vboot of transistor M5 is 0V (i.e. transistor M5 being off) when the high-side switch is on. When the high-side switch is off and the low-side switch is on, the gate control signal g_vboot=Vcc and M5 is on. This allows to measure Vboot during times when the low-side switch is on (gate_ls=ON).

Of course, this concept can be used to signal other fault conditions than an overvoltage at M1. FIG. 7 shows the waveforms of FIG. 6 at a zoomed-in level for a few switching periods. The concept shown in the FIG. 5 is particularly suitable for a system where the high-side supply voltage Vboot is regulated by the control logic and the sensing of the Vboot is required.

In the depicted embodiment, the high-side driver comprises the high-side switch control 5, the high-side switch M1 1, Zenner diode DZ1 24, switch M4 23 and the communication module. At least these elements may be provided on a single driver chip. The supply capacitor Cboot 3 and the diode D14 may be external devices. However, other circuit designs are possible where, e.g., the high-side switch M1 1 is external, or the diode D14 and the supply capacitor Cboot 3 are integrated in the driver IC. Transistor M5 20 is usually part of the control system.

Figure 8:
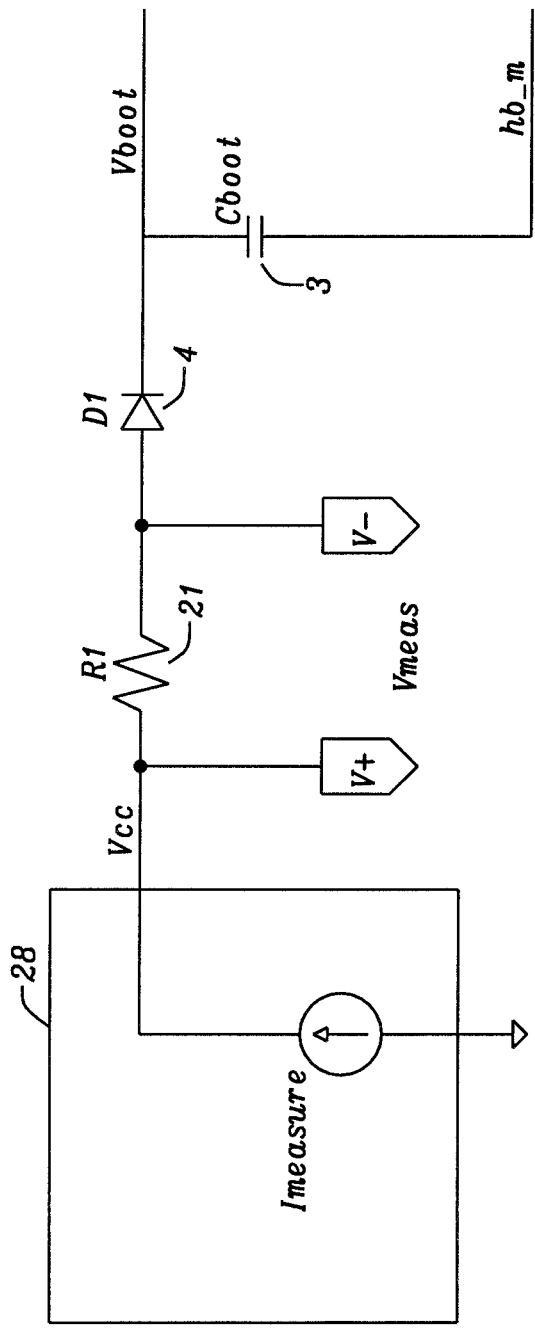
FIG. 8 shows an alternative measuring circuit in the control system.

FIG. 8 shows an alternative measuring circuit for measuring the high-side supply voltage Vboot at the control system, wherein the voltage measuring unit comprises a shunt resistor R1 21 to measure the voltage drop across the resistor between the terminals V+ and V− when the low-side switch is on. Shunt resistor R121 is provided in series with high-voltage diode D1 4. No high-voltage measurement transistor M5 is required in this case. In this circuit, the supply voltage Vcc is provided by a supply circuit 28. When measuring Vboot, a low current Imeasure is supplied. If Vboot<Vcc, the current will cause a voltage drop across resistor R1 21, and Vboot=Vcc-Vmeas−V_D1 where Vmeas is the measured voltage drop across R1 21 and V_D1 is the voltage at diode D14 (typically about 0.7V).

Figure 9:
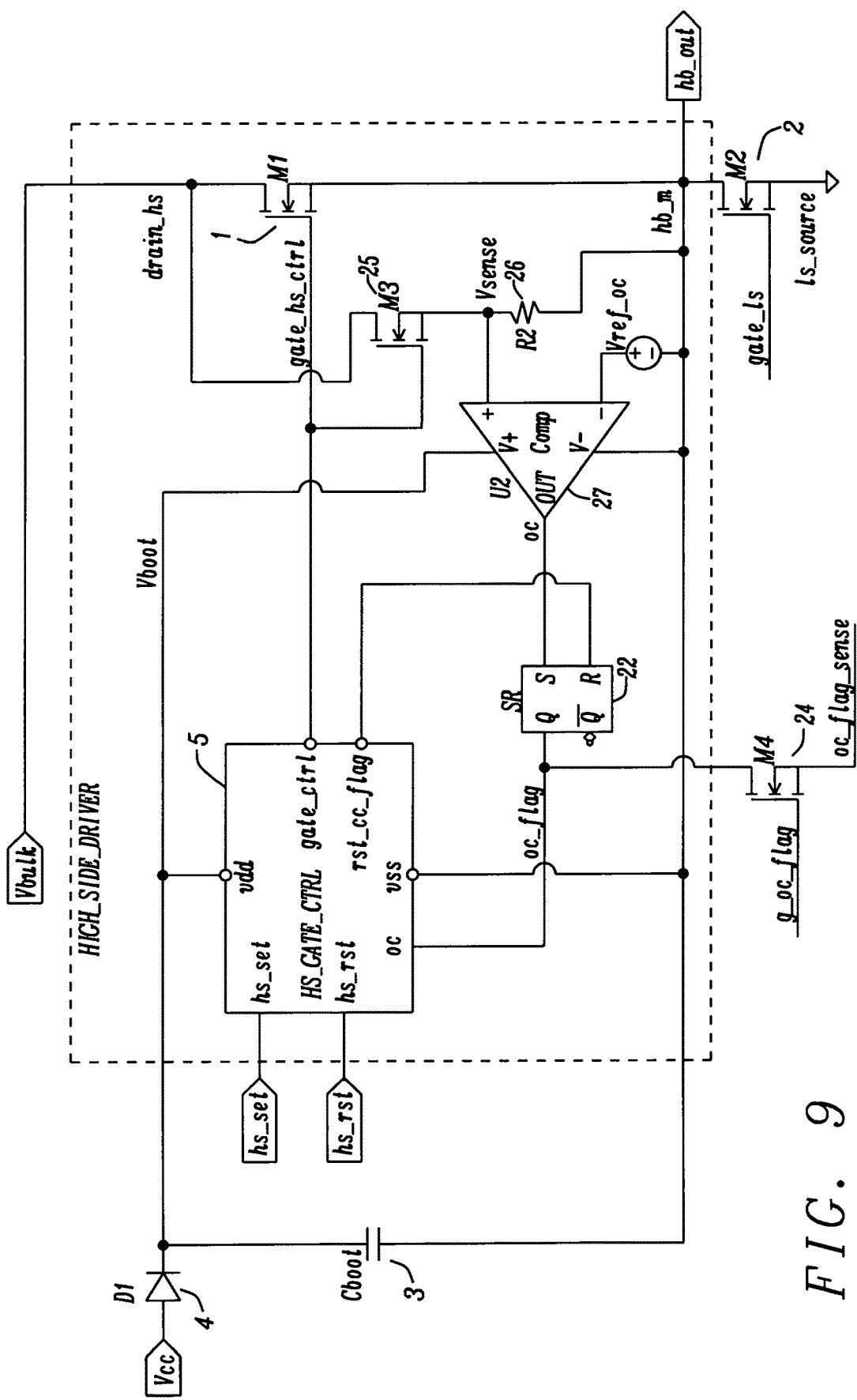
FIG. 9 shows a circuit for high-side fault detection with stored flag.

Next, another possibility to measure the stored flag of the fault condition directly is described, as illustrated in FIG. 9. The forth embodiment uses a separate pin for signaling fault detection. In this case the fault condition is detected and stored in a latch SR 22 during the high-side turn-on phase. The fault condition flag will be sensed during the low-side turn-on phase. The isolation is done by using a high-voltage MOSFET M4 24.

The circuit shown in FIG. 9 is similar to the circuit shown in FIG. 5, with same circuit elements having same names and reference numbers. The control system comprises a high-voltage switch M4 24 that is connected with the output of the fault condition latch 22. The high-voltage switch 24 is (only) enabled during portions of the time when the low-side switch 2 is on. High-voltage switch M4 24 is similar to switch M5 20 of the third embodiment and the above explanations for M5 apply here as well.

Figure 10:
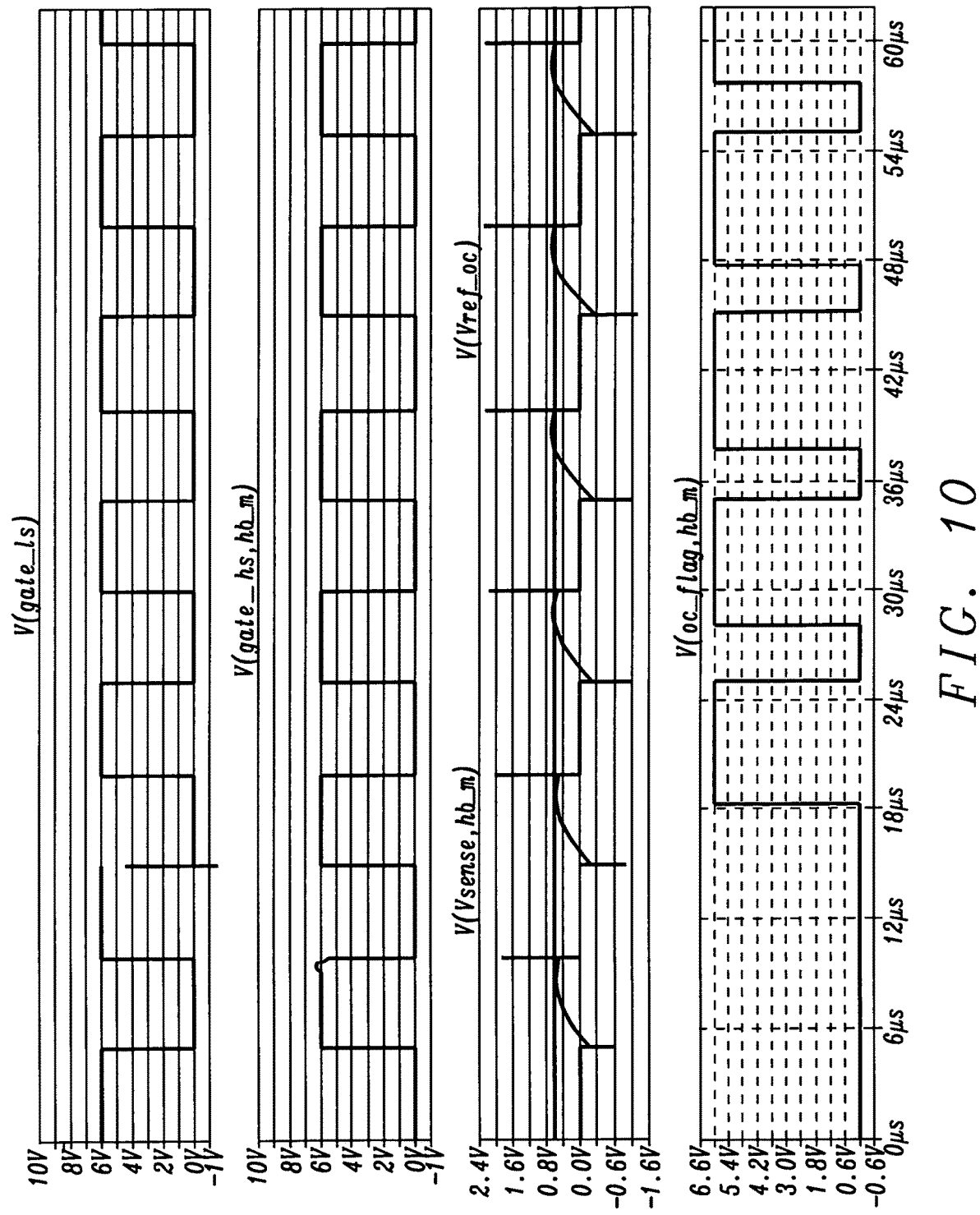
FIG. 10 shows waveforms for fault detection with stored flag.

In this concept an additional pin is required. The flag is set by event detection logic as described before and read during the low-side switching cycle via the high-voltage isolation switch M4 24. The fault condition flag is reset at the rising edge of the high-side gate control signal. The corresponding simulation waveforms are shown in FIG. 10. This figure shows (from top to bottom) the gate voltage Vgate_ls of the low-side switch 2, the gate voltage Vgate_hs of the high-side switch with regards to the voltage at node hb_m, the current sensing voltage Vsense (and Vref_oc) with regards to the voltage at node hb_m, and the output voltage Voc_flag of the latch 22 with regards to the voltage at node hb_m. The above explanations of the waveforms for the third embodiment apply for the forth embodiment as well.

Figure 11:
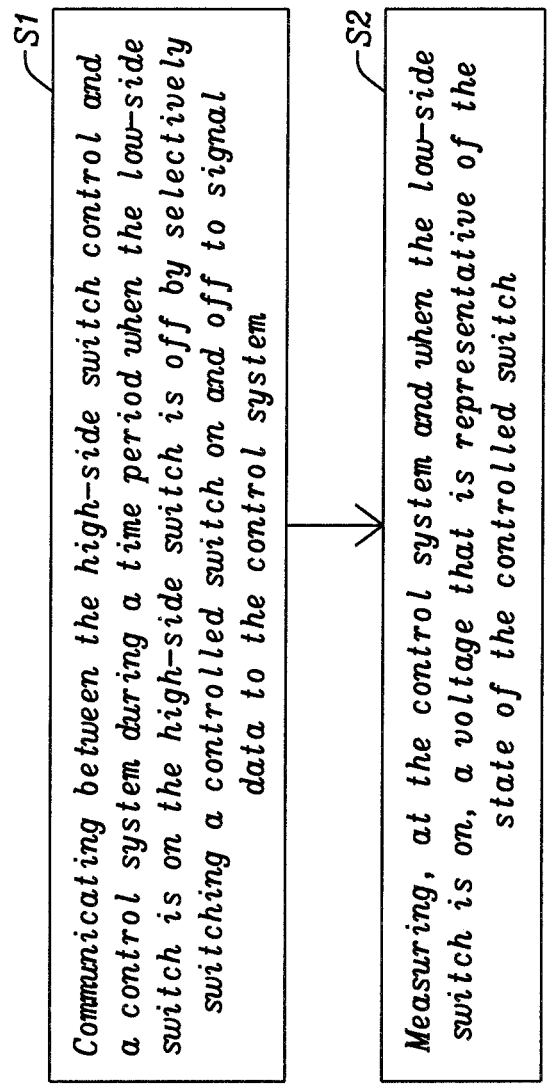
FIG. 11 shows a flowchart illustrating a method for operating a switched mode high-voltage power converter.

FIG. 11 shows an example for a method for operating a switched mode high-voltage power converter comprising a high-side switch coupled with a high-voltage input; a high-side switch control coupled with the high-side switch, the high-side switch control alternately driving the high-side switch on and off; a low-side switch coupled via an output node to the high-side switch, the low-side switch being on when the high-side switch is off and vice versa; and a supply capacitor coupled with a low-voltage supply terminal and the high-side switch control to provide a supply voltage for the high-side switch control. In other words, the power converter may be as described in the above embodiments. The method comprises (step S1) communicating between the high-side switch control and a control system that operates in a low-voltage domain, during a time period when the low-side switch is on and the high-side switch is off. In embodiments, the communicating comprises selectively switching a controlled switch on and off to signal data to the control system. The method further comprises (step S2) measuring, at the control system and when the low-side switch is on, a voltage that is representative of the state of the controlled switch, the measured voltage being a voltage in the low-voltage domain and decoupled from the high-voltage domain of the power converter via a high-voltage diode.

The method may further comprise detecting a fault condition of the power converter; and signaling the fault condition to the control system via said communicating, wherein the signaling of the fault condition is enabled when the low-side switch is on and the high-side switch is off.

The communicating may comprise modulating the supply voltage provided by the supply capacitor and measuring, by the control system, the supply voltage provided by the supply capacitor via the low-voltage supply terminal.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A high-voltage power converter comprising
a high-side switch coupled with a high-voltage input;
a high-side switch control coupled with the high-side switch, the high-side switch control alternately driving the high-side switch on and off;
a low-side switch coupled via an output node to the high-side switch, the low-side switch being on when the high-side switch is off and vice versa;
a supply capacitor coupled with a low-voltage supply terminal and the high-side switch control to provide a supply voltage for the high-side switch control; and
a communication module coupled with the high-side switch control to provide a bidirectional communication between the high-side switch control and a control system that operates in a low-voltage domain, wherein the communication to and from the high-side switch control is enabled when the low-side switch is on and the high-side switch is off, and wherein the communication module comprises a controlled switch in parallel to a resistor, the switch selectively switched on and off to signal data to the control system.

2. The high-voltage power converter of claim 1, wherein a first terminal of the supply capacitor is coupled via a high-voltage diode with the low-voltage supply terminal and a second terminal of the supply capacitor is coupled to the output node.

3. The high-voltage power converter of claim 1, comprising a communication terminal coupled with the controlled switch and the parallel resistor; wherein the communication module comprises an inverter coupled to the communication terminal to receive input data from the communication terminal.

4. The high-voltage power converter of claim 3, wherein the communication terminal is coupled via a second high-voltage diode to a driver of the control system.

5. The high-voltage power converter of claim 4, wherein the driver of the control system comprises an inverter and a resistor.

6. The high-voltage power converter of claim 1, wherein an internal node connected to the controlled switch and the parallel resistor is coupled to a first terminal of a low-voltage diode and a first terminal of the supply capacitor is coupled to a second terminal of the low-voltage diode, the switch selectively switched on and off to modulate the voltage at the low-voltage supply terminal.

7. The high-voltage power converter of claim 6, wherein the driver of the control system comprises a resistor to measure the voltage drop across the resistor when the low-side switch is on.

8. The high-voltage power converter of claim 6, wherein the communication module comprises an inverter coupled to the internal node to receive input data from the control system.

9. A high-voltage power converter comprising
a high-side switch coupled with a high-voltage input;
a high-side switch control coupled with the high-side switch, the high-side switch control alternately driving the high-side switch on and off;
a low-side switch coupled via an output node to the high-side switch, the low-side switch being on when the high-side switch is off and vice versa;
a supply capacitor coupled with a low-voltage supply terminal and the high-side switch control to provide a supply voltage for the high-side switch control; and
a fault detection and signaling module to detect a fault condition of the power converter and to signal the fault condition to a control system that operates in a low-voltage domain, wherein the signaling of the fault condition is enabled when the low-side switch is on and the high-side switch is off, wherein a first terminal of the supply capacitor is coupled via a high-voltage diode with the low-voltage supply terminal and the second terminal of the supply capacitor is coupled to the output node.

10. The high-voltage power converter of claim 9, wherein the control system comprises a voltage measuring unit to measure, during portions of the time when the low-side switch is on, a voltage of the supply capacitor.

11. The high-voltage power converter of claim 10, wherein the voltage measuring unit comprises a high-voltage switch that is enabled during portions of the time when the low-side switch is on.

12. The high-voltage power converter of claim 10, wherein the voltage measuring unit comprises a resistor to measure the voltage drop across the resistor when the low-side switch is on.

13. The high-voltage power converter of claim 9, wherein the fault detection and signaling module comprises a current sensing portion to detect an overcurrent in the high-side switch.

14. The high-voltage power converter of claim 9, wherein the fault detection and signaling module comprises a fault condition latch that is triggered upon detection of a fault condition.

15. The high-voltage power converter of claim 9, wherein the fault detection and signaling module comprises a controlled switch and a Zener diode that is connected with the low-voltage supply terminal, the controlled switch enabled during portions of the time when the low-side switch is on, thereby selectively reducing the supply voltage provided by the supply capacitor.

16. The high-voltage power converter of claim 14, wherein the control system comprises a high-voltage switch that is connected with the output of the fault condition latch, the high-voltage switch enabled during portions of the time when the low-side switch is on.

17. A method for operating a high-voltage power converter comprising a high-side switch coupled with a high-voltage input; a high-side switch control coupled with the high-side switch, the high-side switch control alternately driving the high-side switch on and off; a low-side switch coupled via an output node to the high-side switch, the low-side switch being on when the high-side switch is off and vice versa; and a supply capacitor coupled with a low-voltage supply terminal and the high-side switch control to provide a supply voltage for the high-side switch control, the method comprising the step of:

communicating between the high-side switch control and a control system that operates in a low-voltage domain, during a time period when the low-side switch is on and the high-side switch is off, wherein said communicating comprises selectively switching a controlled switch on and off to signal data to the control system and measuring, at the control system and when the low-side switch is on, a voltage that is representative of the state of the controlled switch, the measured voltage being a voltage in the low-voltage domain and decoupled from the high-voltage domain of the power converter via a high-voltage diode.

18. The method of claim 17, wherein the high-voltage power converter comprises a communication terminal coupled with the controlled switch and the parallel resistor, the communication terminal coupled via a high-voltage diode to a driver of the control system, wherein the communication module comprises an inverter coupled to the communication terminal to receive input data via the communication terminal from the control system.

19. The method of claim 17, wherein the controlled switch is selectively switched on and off when the low-side switch is on, to modulate the voltage at the low-voltage supply terminal.

20. The method of claim 19, wherein a voltage drop across a resistor of the control system is measured when the low-side switch is on, to determine the voltage at the low-voltage supply terminal.

21. The method of claim 17, further comprising the steps of:

detecting a fault condition of the power converter; and signaling the fault condition to the control system via said communicating, wherein the signaling of the fault condition is enabled when the low-side switch is on and the high-side switch is off.

22. The method of claim 21, wherein said communicating further comprises the step of: modulating the supply voltage provided by the supply capacitor and measuring, by the control system, the supply voltage provided by the supply capacitor via the low-voltage supply terminal.

23. The method of claim 21, further comprising the steps of:

triggering a fault condition latch upon detection of a fault condition; and detecting, by the control system, the state of the fault condition latch when the low-side switch is on.

\* \* \* \* \*